(12) United States Patent
Kusuda

(10) Patent No.: US 8,934,161 B2
(45) Date of Patent: Jan. 13, 2015

(54) METHOD OF MANUFACTURING OPTICAL SCANNING APPARATUS AND OPTICAL SCANNING APPARATUS

(75) Inventor: Shinya Kusuda, Nagoya (JP)

(73) Assignee: Brother Kogyo Kabushiki Kaisha, Nagoya-Shi, Aichi-Ken (JP)

( * ) Notice: Subject to any disclaimer, the term of this patent is extended or adjusted under 35 U.S.C. 154(b) by 214 days.

(21) Appl. No.: 13/363,111

(22) Filed: Jan. 31, 2012

(65) Prior Publication Data

US 2012/0218614 A1 Aug. 30, 2012

(30) Foreign Application Priority Data

Feb. 24, 2011 (JP) ................................. 2011-037881

(51) Int. Cl.
*G02B 26/08* (2006.01)
*H05K 3/30* (2006.01)
*G02B 26/12* (2006.01)

(52) U.S. Cl.
CPC .............. *H05K 3/301* (2013.01); *G02B 26/123* (2013.01); *G02B 26/124* (2013.01); *H05K 2201/10121* (2013.01); *H05K 2203/0195* (2013.01); *H05K 2203/167* (2013.01); *Y10S 359/90* (2013.01)
USPC .......................... 359/204.1; 359/900; 361/760

(58) Field of Classification Search
CPC ..... G02B 26/123; G02B 26/124; B41J 2/471; B41J 2/473; H05K 3/301; H05K 2201/10121; H05K 2203/015; H05K 2203/167
USPC ............ 359/196.1–226.2; 347/233, 241–245, 347/256–261
See application file for complete search history.

(56) References Cited

U.S. PATENT DOCUMENTS

| 5,617,441 | A | 4/1997 | Nakata et al. | |
| 7,535,610 | B2 * | 5/2009 | Kitaoka et al. | 359/196.1 |

FOREIGN PATENT DOCUMENTS

| JP | H02-174179 | A | | 7/1990 |
| JP | H03-077469 | U | | 8/1991 |
| JP | H05-164950 | A | | 6/1993 |
| JP | H07-170365 | A | | 7/1995 |
| JP | H08-082759 | A | | 3/1996 |
| JP | H09-329754 | A | | 12/1997 |
| JP | H11-064765 | A | | 3/1999 |
| JP | 2008-180873 | | * | 8/2008 |
| JP | 2008-180873 | A | | 8/2008 |
| JP | 2009-198678 | A | | 9/2009 |

OTHER PUBLICATIONS

Japan Patent Office, Notification of Reasons for Refusal for Japanese Patent Application No. 2011-037881 (counterpart Japanese patent application), dispatched Jan. 29, 2013.

* cited by examiner

*Primary Examiner* — James Phan
(74) *Attorney, Agent, or Firm* — Merchant & Gould PC

(57) ABSTRACT

A method of manufacturing an optical scanning apparatus which includes: a light source having a plurality of luminous points; a coupling lens converting a plurality of beams from the light source into luminous flux; a deflector deflecting the luminous flux in a main scanning direction; a scanning lens focusing the luminous flux from the deflector onto a scanned surface so as to form an image; and a frame supporting at least the light source and the coupling lens, the method includes: fixing a coupling lens to a frame; adjusting a position of the light source, relative to the coupling lens fixed to the frame, while the light source emits the light; adjusting a pitch between the plurality of beams the optical axis while the light source emits the light; and fixing the light source to the frame at the adjusted position and the adjusted pitch.

8 Claims, 6 Drawing Sheets

METHOD OF MANUFACTURING OPTICAL SCANNING APPARATUS AND OPTICAL SCANNING APPARATUS

CROSS-REFERENCE TO RELATED APPLICATION

This application is based upon and claims the benefit of priority of Japanese Patent Application No. 2011-037881 filed on Feb. 24, 2011, the contents of which are incorporated herein by reference in its entirety.

BACKGROUND

The present disclosure relates to a method of manufacturing an optical scanning apparatus including a light source having a plurality of luminous points, and the optical scanning apparatus.

In the related art, there has been a known optical scanning apparatus which includes a light source having a plurality of luminous points, a coupling lens for converting light from the light source into luminous flux, a deflector for deflecting the luminous flux in a main scanning direction, and a scanning lens for focusing the light from the deflector onto a scanned surface so as to form an image. In this optical scanning apparatus, in order to accurately focus the light onto the scanned surface such that the image is formed, it is required to adjust the positions of the individual optical components and accurately dispose the optical components.

For example, a light source (a semiconductor laser source) is fixed to a holder of a laser unit, the positions of the light source and the coupling lens in three directions, that is, X, Y, and Z directions are adjusted by moving a lens barrel having a built-in coupling lens (collimator lens), and then the lens barrel is fixed to the holder. Further, when the laser unit is fixed into an optical box having a deflector and a scanning lens attached thereto, the laser unit is rotated such that a pitch between two beams in a sub-scanning direction on a scanned surface is adjusted, and then the laser unit is fixed into the optical box.

SUMMARY

In the above-mentioned related art, when the laser unit is assembled, the positions of the light source in the three directions (directions perpendicular to an optical axis, and an optical axis direction) are adjusted, and when the laser unit (light source) is fixed into the optical box, the pitch is adjusted. Therefore, when the optical scanning apparatus is manufactured, processes for adjusting the position of the light source increases.

An aspect of the present disclosure was made considering the above-mentioned background, and an object is to provide a method of manufacturing an optical scanning apparatus capable of simplifying manufacturing processes, and the optical scanning apparatus.

The aspect of the present disclosure provides the following arrangements:

A method of manufacturing an optical scanning apparatus which includes: a light source having a plurality of luminous points; a coupling lens configured to convert a plurality of beams from the light source into luminous flux; a deflector configured to deflect the luminous flux in a main scanning direction; a scanning lens configured to focus the luminous flux from the deflector onto a scanned surface so as to form an image; and a frame configured to support at least the light source and the coupling lens, the method comprising:

fixing the coupling lens to the frame;

adjusting a position of the light source, relative to the coupling lens fixed to the frame, in an optical axis direction of the light source and in a direction perpendicular to the optical axis direction while the light source emits the light;

adjusting a pitch between the plurality of beams in a sub-scanning direction perpendicular to the main scanning direction on the scanned surface by rotating the light source around the optical axis while the light source emits the light; and fixing the light source to the frame at the adjusted position and the adjusted pitch.

An optical scanning apparatus comprising:

a light source having a plurality of luminous points;

a circuit board configured to supply power to the light source, the light source being assembled on the circuit board;

a coupling lens configured to convert a plurality of beams from the light source into luminous flux;

a deflector configured to deflect the luminous flux in a main scanning direction;

a scanning lens configured to focus the luminous flux from the deflector onto a scanned surface so as to form an image; and a frame configured to support at least the light source and the coupling lens, wherein the circuit board is fixed to the frame with an adhesive in a state that a position of the light source relative to the coupling lens fixed to the frame in an optical axis direction of the light source and in a direction perpendicular to the optical axis direction while the light source emits the light is adjusted, and a pitch between the plurality of beams in a sub-scanning direction perpendicular to the main scanning direction on the scanned surface is adjusted.

DESCRIPTION OF EXEMPLARY EMBODIMENTS

Hereinafter, an exemplary embodiment will be described in detail with reference to appropriate drawings. In the following description, an optical axis means a virtual optical axis of an optical scanning apparatus 1 (optical system), and in the present embodiment, it is assumed that the optical axis (optical axis A) is equidistant from the optical axes A1 and A2 of two laser beams which are emitted from a semiconductor laser 10 (light source), and is at the shortest distance from the optical axes A1 and A2 (see FIG. 4B).

Figure 1:
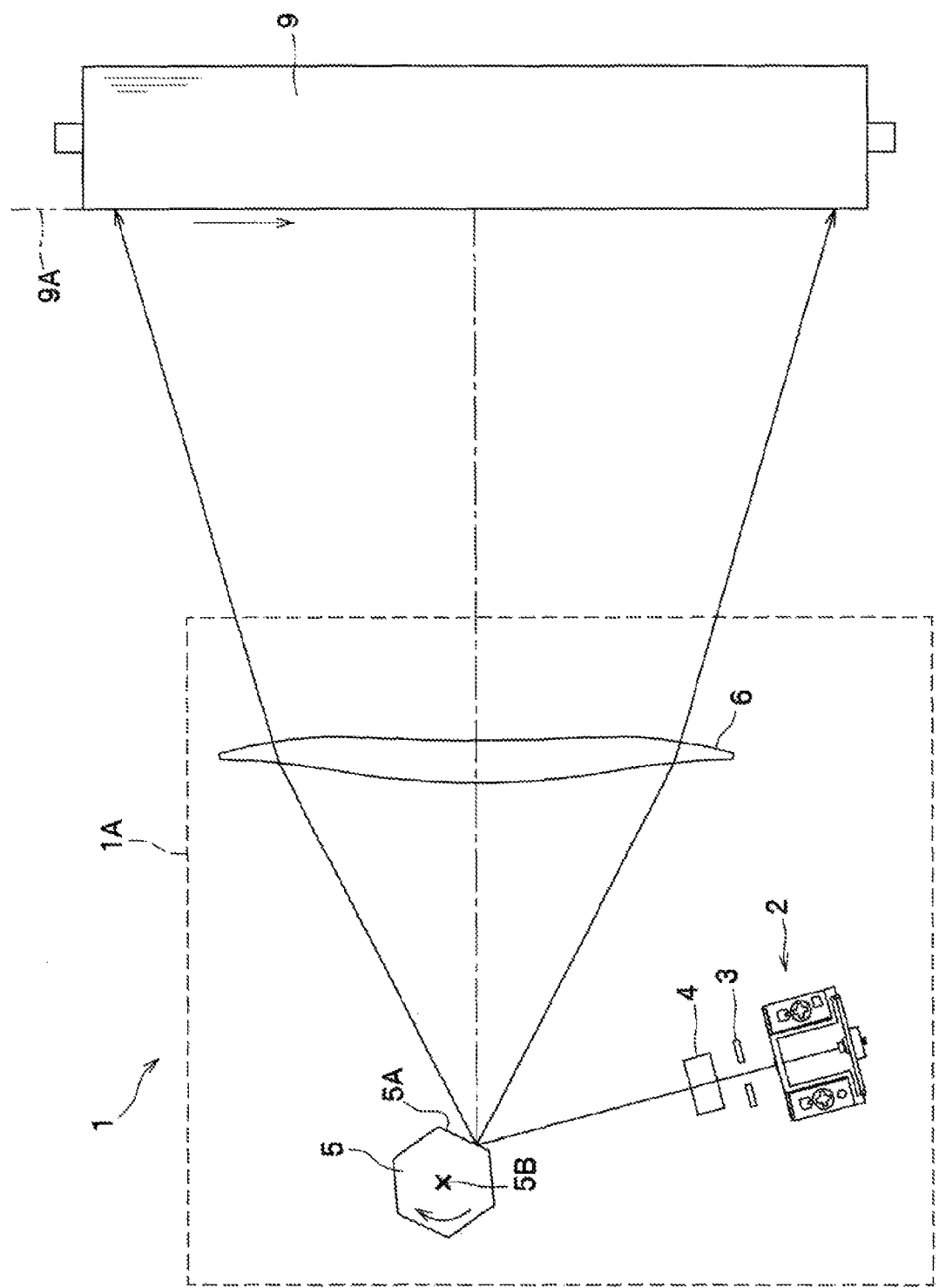
FIG. 1 is a view illustrating a schematic configuration of an optical scanning apparatus according to an embodiment.

As shown in FIG. 1, the optical scanning apparatus 1 mainly includes a light source unit 2, an aperture stop 3, a cylindrical lens 4, a polygon mirror 5 which is an example of a deflector, and an F-theta lens 6 which is an example of a scanning lens, and is configured to focus laser beams emitted from the light source unit 2 in a spot form onto a scanned surface 9A of a photosensitive drum 9 and perform scanning in a direction shown by an arrow in FIG. 1. The individual optical components are fixed to a substantially box-shaped case 1A.

Figure 2A:
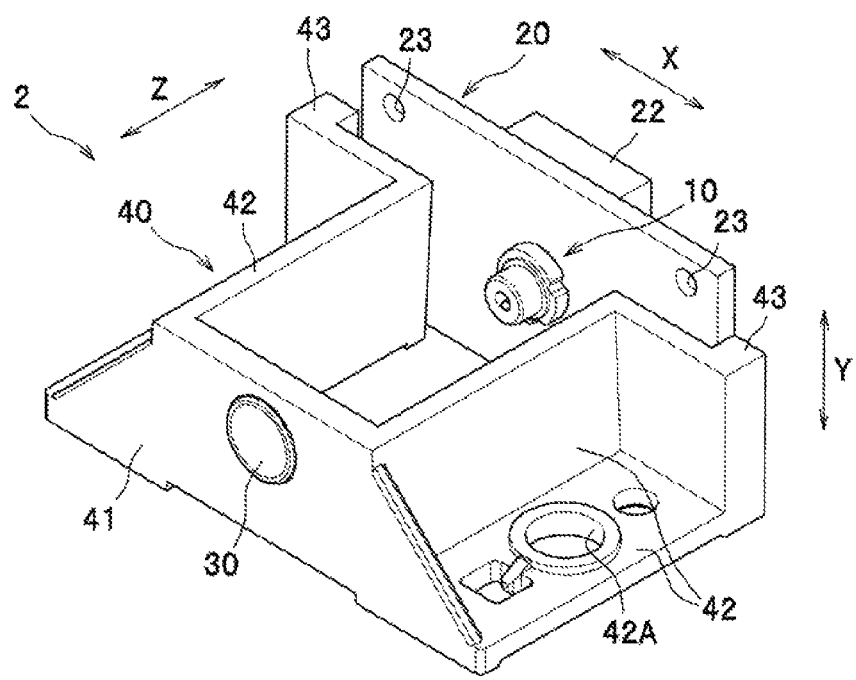
FIG. 2A is a perspective view of a light source unit.
Figure 2B:
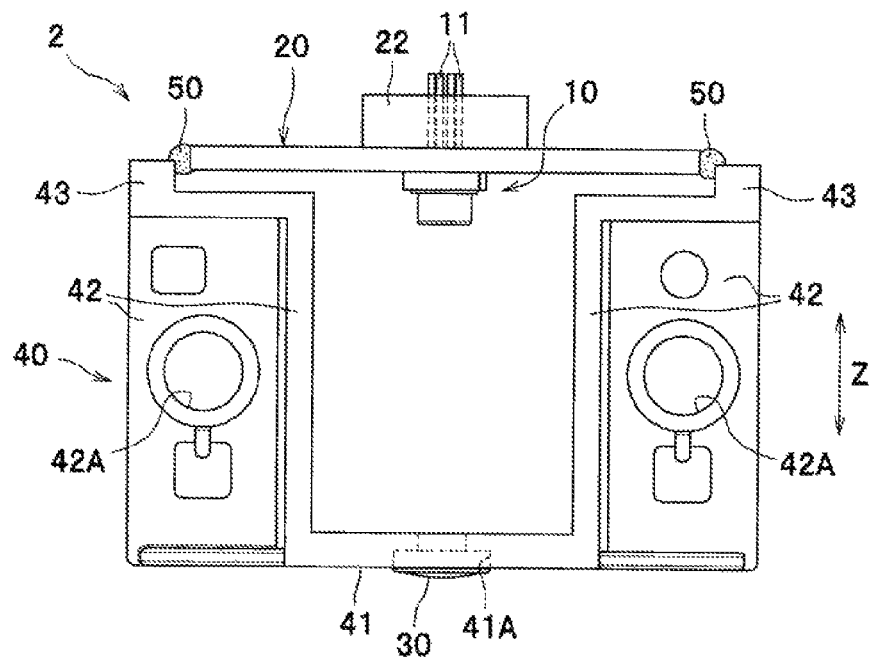
FIG. 2B is a plan view of the light source unit.

As shown in FIGS. 2A and 2B, the light source unit 2 mainly includes the semiconductor laser 10 which is an example of the light source, a circuit board 20, a collimator lens 30 which is an example of a coupling lens, and a frame 40.

The semiconductor laser 10 is a light emission element which has two (a plurality of) luminous points and emits two laser beams by power supply. The semiconductor laser 10 is assembled with the circuit board 20 by inserting four lead pins 11 into through-holes 21 (see FIG. 3) of the circuit board 20 and performing soldering.

The circuit board 20 is a substantially rectangular printed board having a circuit (not shown) for supplying power to the semiconductor laser 10. This circuit board 20 has a female connector 22 (a connector) which is connected with a male connector C (see FIG. 3) extending from an external power source (not shown) for supplying power to the semiconductor laser 10. Further, the circuit board 20 has holes 23 pierced in upper portions of its both ends in the longitudinal direction as shown in FIG. 2A.

The collimator lens 30 is a lens for converting the laser beams from the semiconductor laser 10 into luminous flux. According to the aspect of the disclosure, the luminous flux may be any one of parallel light, convergent light, and divergent light.

The frame 40 is a member for supporting the circuit board 20 having a semiconductor laser 10 assembled thereon, and the collimator lens 30, and mainly includes a lens supporting wall 41, a pair of connecting walls 42, and a pair of board supporting walls 43.

The lens supporting wall 41 is a wall for supporting the collimator lens 30, and has an opening 41A which is engaged with the collimator lens 30. The collimator lens 30 is fixed to the lens supporting wall 41 with an adhesive or the like (not shown).

The pair of connecting walls 42 are walls extending in the optical axis direction (Z direction) so as to connect the lens supporting wall 41 and the pair of board supporting walls 43, and are formed almost in an L shape as seen from the optical axis direction. A lower wall (shown in FIG. 2A) of each of the connecting walls 42 has a through-hole 42A for allowing a screw (see FIG. 1 although its reference symbol is not shown) for fixing the frame 40 (the light source unit 2) to the case 1A of the optical scanning apparatus 1.

The pair of board supporting walls 43 are walls for supporting the semiconductor laser 10, and extend outward from end portions of the connecting walls 42 on the circuit board (20) side so as to be in parallel with the circuit board 20, and then extend in the optical axis direction to allow the circuit board 20 enter therebetween.

The positions of the semiconductor laser 10, relative to the collimator lens 30 fixed to the lens supporting wall 41, in directions (an X direction and a Y direction) perpendicular to the optical axis, and in the optical axis direction, and a pitch D (see FIG. 4B) between the two laser beams in the sub-scanning direction on the scanned surface 9A are adjusted, and then the circuit board 20 is fixed to the pair of board supporting walls 43 with an adhesive 50, whereby the semiconductor laser 10 is supported by the frame 40 through the circuit board 20. In the present embodiment, the adhesive 50 is light curing resin (such as UV curing resin) which cures by irradiation of light having a specific wavelength.

Incidentally, when the circuit board 50 is fixed to the pair of board supporting walls 43 with the adhesive 50, an allowance is provided between the circuit board 20 and the pair of board supporting walls 43 to allow the positional adjustment. Specifically, a clearance in the axial direction is provided between the circuit board 50 and the pair of board supporting walls 43, and a clearance in a direction perpendicular to the axial direction is also provided between the circuit board 50 and the pair of board supporting walls 43 as shown in FIG. 2B. In other words, the circuit board 50 does not contact the pair of board supporting walls 43 and is connected to the pair of board supporting walls only through the adhesive 50.

Referring to FIG. 1 again, the aperture stop 3 is a plate-shaped member that has a substantially rectangular aperture and defines the diameter of the luminous flux obtained by the conversion on the laser beams by the collimator lens 30.

The cylindrical lens 4 is a lens that focuses the laser beams having passed through the collimator lens 30 and the aperture stop 3 onto the polygon mirror 5 (a mirror surface 5A) so as to form a linear image that is long in the main scanning direction (the direction along the paper plane of FIG. 1).

The polygon mirror 5 is a member that has six mirror surfaces 5A disposed at the same distance from a rotation shaft 5B. This polygon mirror 5 rotates around the rotation shaft 5B at a constant speed, and deflects the laser beams having passed through the cylindrical lens 4 in the main scanning direction so as to perform scanning The F-theta lens 6 is a lens for converging or refracting the laser beams from the polygon mirror 5 in the main scanning direction and the sub-scanning direction so as to form a spot-shaped image on the scanned surface 9A, and correcting the flatness of the mirror surfaces 5A of the polygon mirror 5. This F-theta lens 6 has an F-theta feature such that the scanned surface 9A is scanned at a constant speed with the laser beams deflected at the constant speed by the polygon mirror 5.

Now, a method of manufacturing the optical scanning apparatus 1 will be described with reference to appropriate drawings.

Figure 3:
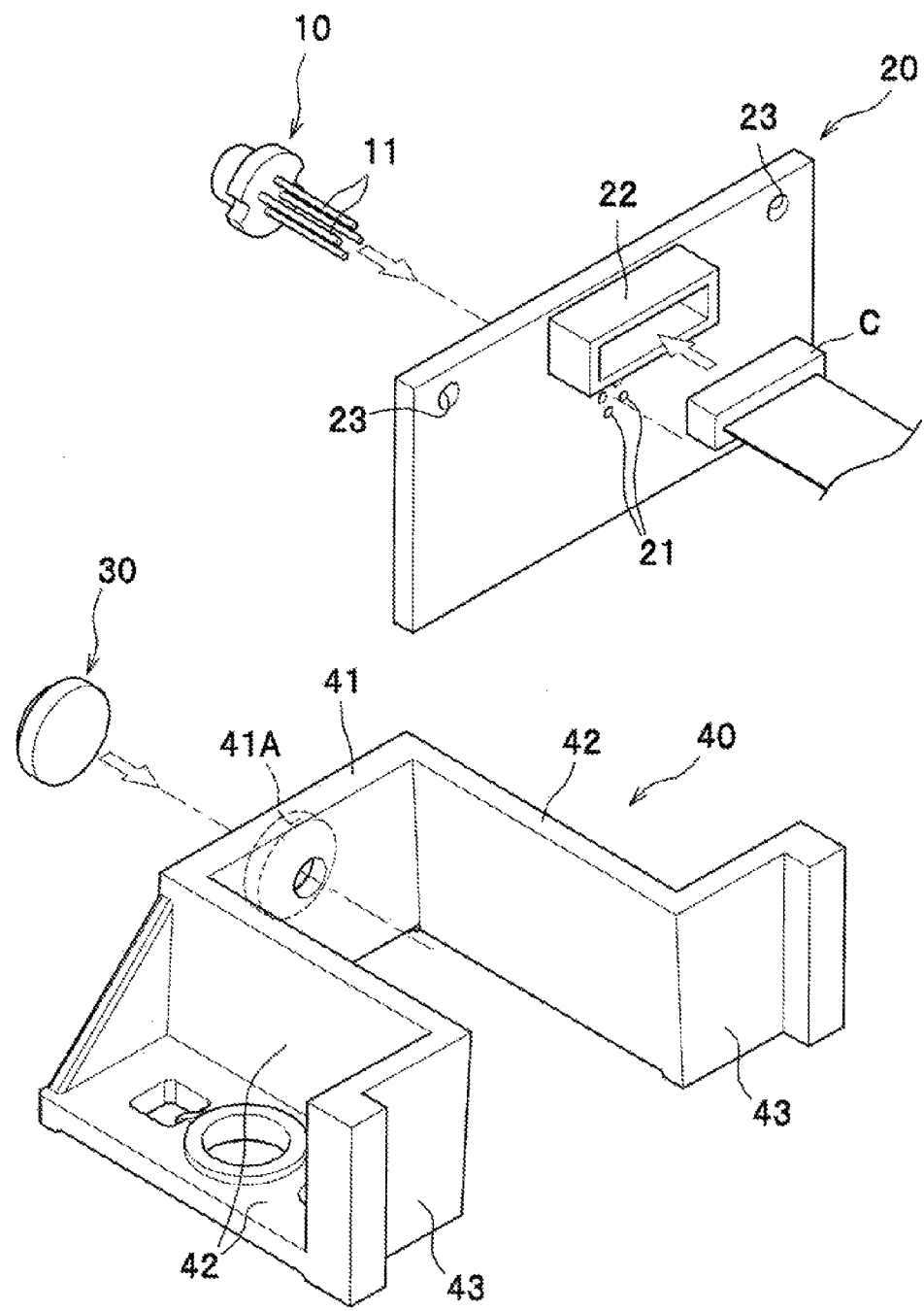
FIG. 3 is an explanatory view of a coupling-lens fixing process and a board assembling process.

As shown in FIG. 3, first, the collimator lens 30 is fixed to the lens supporting wall 41 (the frame 40) by bonding or the like (a coupling-lens fixing process).

Then, the lead pins 11 of the semiconductor laser 10 are inserted into the through-holes 21 of the circuit board 20 and soldering is performed, such that the semiconductor laser 10 is assembled on the circuit board 20 (a board assembling process). Next, an end portion (the male connector C) of a cable extending from the external power source (not shown) is connected to the female connector 22 provided to the circuit board 20. An order in which the coupling-lens fixing process and the board assembling process are performed is not particularly limited.

Figure 4A:
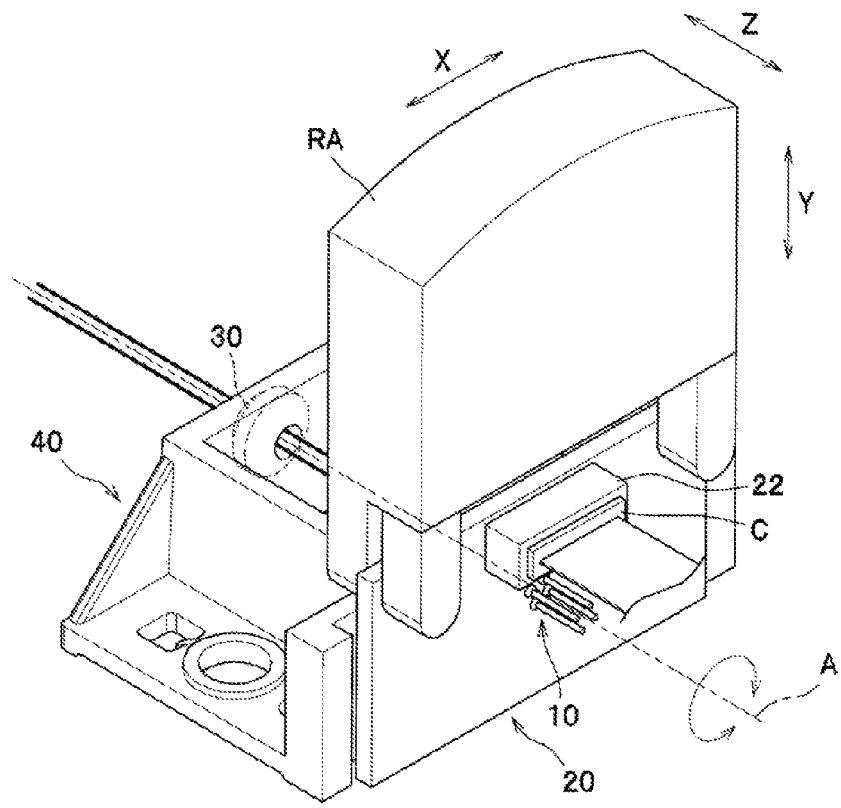
FIGS. 4A and 4B are explanatory views of an adjusting process.

After the coupling-lens fixing process and the board assembling process are performed, as shown in FIG. 4A, while power is supplied from the external power source to the circuit board 20 such that the semiconductor laser 10 emits light, the position of the semiconductor laser 10 (the circuit board 20) relative to the collimator lens 30, and the pitch D between the two laser beams in the sub-scanning direction on the scanned surface 9A are adjusted (an adjusting process).

More specifically, in the adjusting process, first, the circuit board 20 is held, for example, by inserting pins (not shown) of an arm RA of a position adjusting robot which is an example of a tool for adjusting the position of the semiconductor laser 10 assembled on the circuit board 20, into the pair of holes 23 (see FIG. 3) provided to the circuit board 20, and the semiconductor laser 10 is made emit light (emit two laser beams).

In this state, while the laser beams are made enter a measuring device (not shown), the arm RA is moved in the X direction and the Y direction, whereby the positions of the semiconductor laser 10, relative to the collimator lens 30 fixed to the frame 40, in the directions perpendicular to the optical axis are adjusted. Further, while the laser beams are made enter the measuring device, the arm RA is moved in the Z direction, whereby the position (focus position) of the semiconductor laser 10, relative to the collimator lens 30 fixed to the frame 40, in the optical axis direction is adjusted.

Figure 4B:
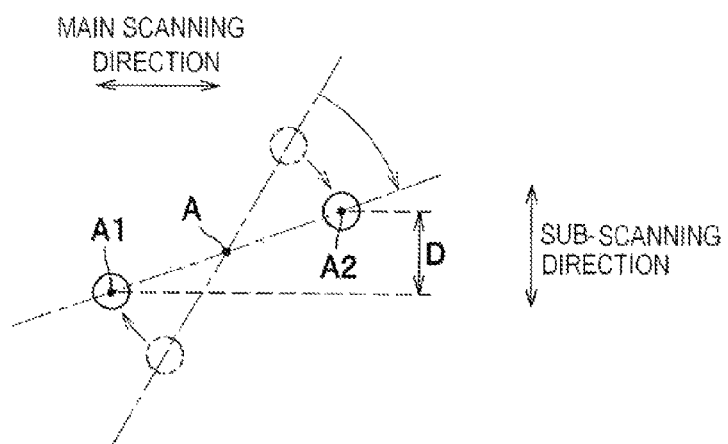

Furthermore, after at least the focus position is determined, while the laser beams are made enter the measuring device, the arm RA is rotated such that the circuit board 20 (the semiconductor laser 10) rotates around the optical axis A as shown in FIG. 4B, whereby the pitch D between the two laser beams in the sub-scanning direction on the scanned surface 9A is adjusted.

In the present embodiment, the adjustment of the pitch D is not limited to direct adjustment on the scanned surface 9A, but may be performed by using a measuring device having a sensor capable of measuring a light amount distribution of the two laser beams at an optical position equivalent to the scanned surface 9A.

Figure 5:
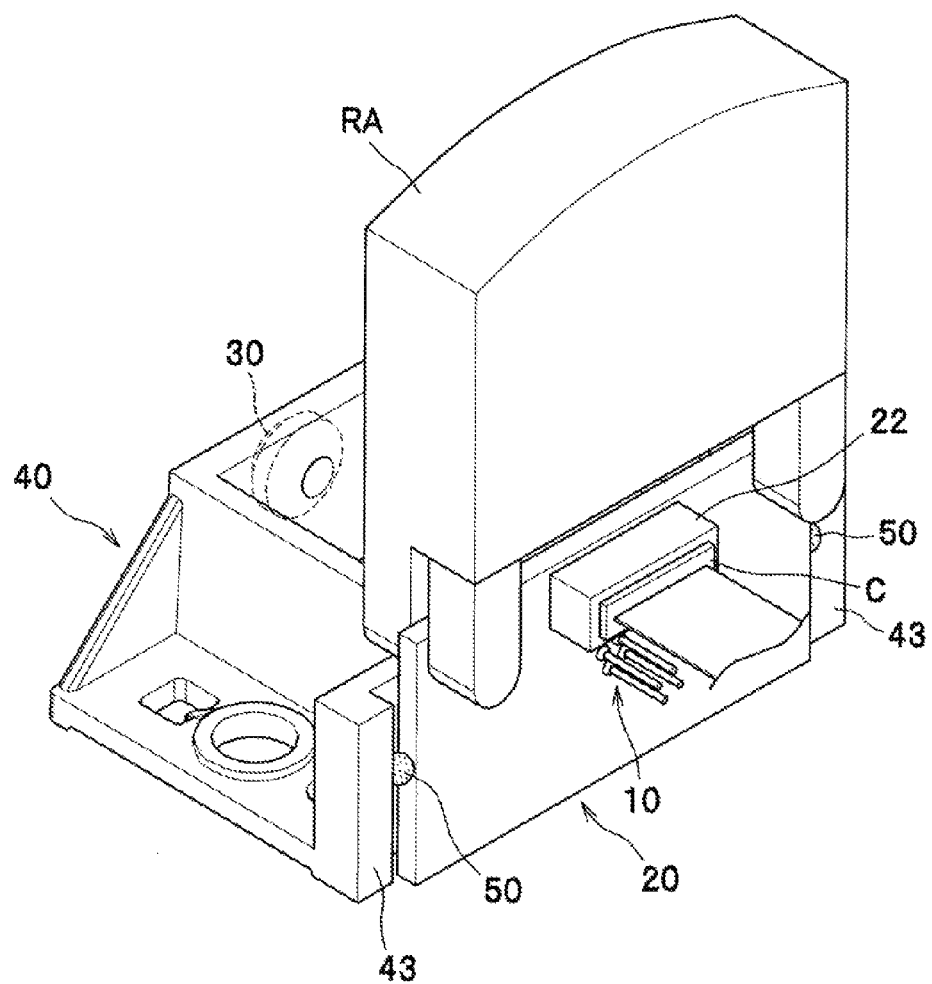
FIG. 5 is an explanatory view of a light-source fixing process.

Next, as shown in FIG. 5, the semiconductor laser 10 positioned by the adjusting process is fixed to the frame 40 (a light-source fixing process). More specifically, in the light-source fixing process, the circuit board 20 having the semiconductor laser 10 assembled thereon is fixed between the pair of board supporting walls 43 with the adhesive 50, whereby the semiconductor laser 10 is fixed to the frame 40 through the circuit board 20.

In the present embodiment, since the adhesive 50 is light curing resin, it is possible to easily fix the circuit board 20 (the semiconductor laser 10) to the frame 40 by irradiation of light. Further, since it is possible to fix the circuit board 20 (the semiconductor laser 10) to the frame 40 within a short time, it is possible to suppress misalignment of the semiconductor laser 10, as compared to a case of using an adhesive that takes a long time to cure.

Furthermore, in order to suppress misalignment of the semiconductor laser 10 according to the contraction of the adhesive 50 or the like, it is preferable to apply the same amount of adhesive 50 at positions substantially symmetrical to each other with respect to the semiconductor laser 10.

Then, like the related art, the positions of the light source unit 2 assembled as described above, the aperture stop 3, the cylindrical lens 4, the polygon mirror 5, and the F-theta lens 6 are adjusted with respect to one another, and these optical components are fixed to the case 1A, whereby it is possible to manufacture the optical scanning apparatus 1.

According to the above-mentioned configuration, in the present embodiment, it is possible to achieve the following effects.

According to the manufacturing method of the present embodiment, first, the positions of the semiconductor laser 10, relative to the collimator lens 30 fixed to the frame 40, in the directions perpendicular to the optical axis and in the optical axis direction, and the pitch D between the two laser beams in the sub-scanning direction on the scanned surface 9A are adjusted, and then the semiconductor laser 10 is fixed to the frame 40. Therefore, after the semiconductor laser 10 is fixed to the frame 40, it is hardly necessary to adjust the position of the semiconductor laser 10.

In the related art as disclosed in Japanese Patent Application Laid-Open No. 11-64765, the adjustment of the pitch requires to further adjust the position of the frame (that is, the light source unit) having the coupling lens and the light source fixed thereto when the light source unit is attached to the case of the optical scanning apparatus. However, this process can be omitted in the manufacturing method of the present embodiment. Therefore, it is possible to simplify the manufacturing processes.

Further, in the manufacturing method of the present embodiment, since the adjusting process is performed while power is supplied to the circuit board 20 having the semiconductor laser 10 assembled thereon, the power is easily supplied to the semiconductor laser 10, as compared to a case where the semiconductor laser 10 is directly held and then the adjusting process is performed, a case where the semiconductor laser 10 is assembled on a member (such as heat sink) other than the circuit board 20, and then the adjusting process is performed, or the like. Therefore, it is possible to simplify the processes and equipment for manufacturing the optical scanning apparatus 1.

Particularly, in the present embodiment, since the circuit board 20 has the female connector 22, and supply of power to the circuit board 20 is performed by connecting the external power source to that female connector 22, it is possible to more easily supply power to the semiconductor laser 10 during the adjusting process. This female connector 22 can be used as a power supply port to the semiconductor laser 10 after the light source unit 2 is fixed to the case 1A (after the optical scanning apparatus 1 is completed).

In the manufacturing method of the present embodiment, since the semiconductor laser 10 is first assembled on the circuit board 20, and then the adjusting process is performed while the pair of holes 23 provided to the circuit board 20 are held by the arm RA of the position adjusting robot, it is possible to stabilize the semiconductor laser 10 (the circuit board 20) during the adjusting process, as compared to the case where the semiconductor laser 10 is directly held and then the adjusting process is performed. Therefore, it is possible to improve the accuracy of the position of the semiconductor laser 10 and the pitch D between the two laser beams.

According to the optical scanning apparatus 1 of the present embodiment, since the circuit board 20 having the semiconductor laser 10 assembled thereon is fixed to the frame 40 with the adhesive 50, it is possible to increase the degree of freedom for the position of the circuit board 20 (that is, the semiconductor laser 10) relative to the frame 40, as compared to a configuration in which the circuit board 20 is fixed to the frame 40 with screws or the like. Therefore, it is possible to easily implement the above-mentioned manufacturing method. As a result, adjustment of the position of the semiconductor laser 10 is rarely necessary after the semiconductor laser 10 is fixed to the frame 40, and thus it is possible to simplify the manufacturing processes.

Although the exemplary embodiment has been described above, the present invention is not limited to the above-mentioned embodiment. The specific configuration can be appropriately modified within the scope of the present invention.

Figure 6:
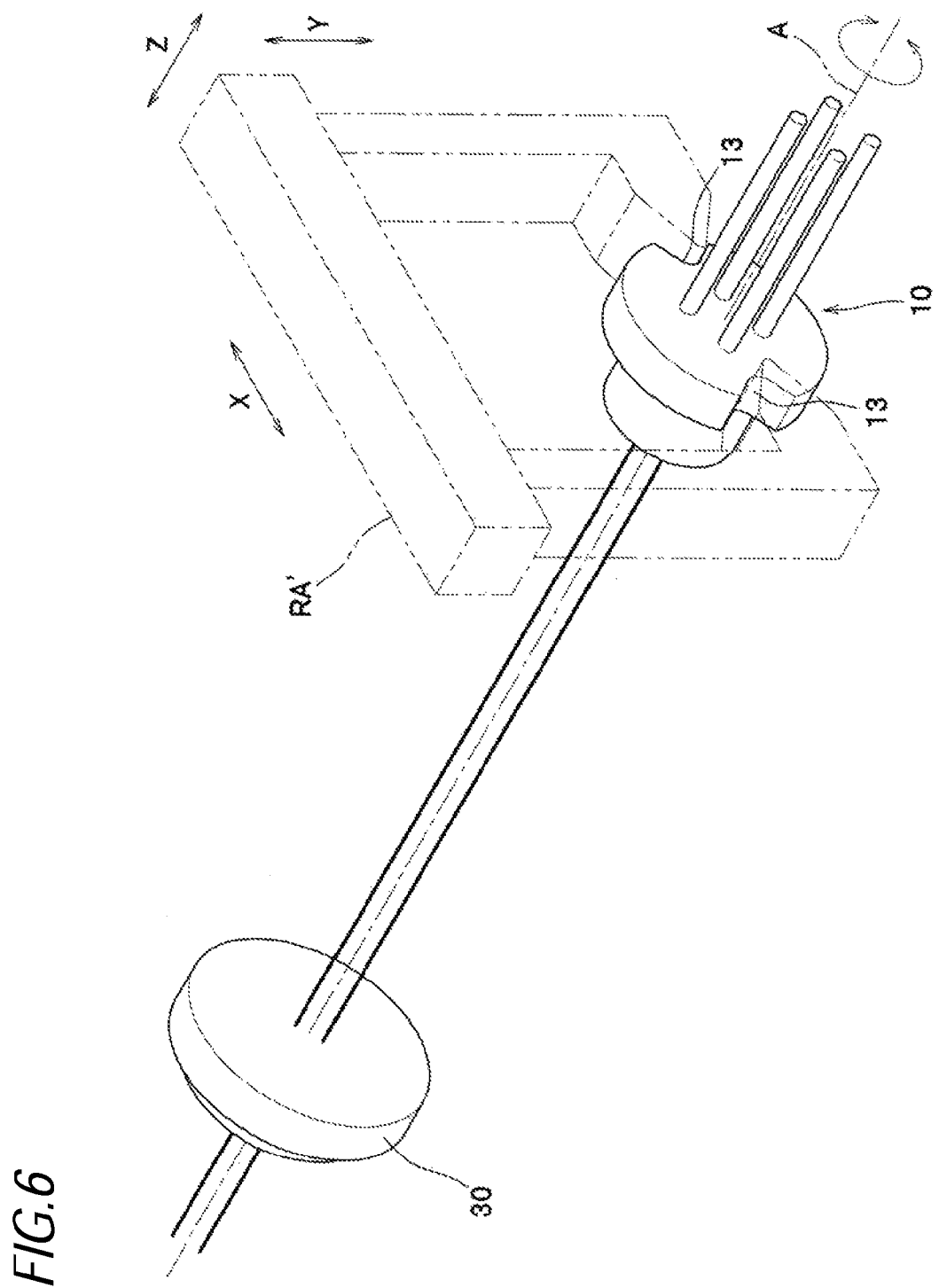
FIG. 6 is an explanatory view of an adjusting process according to a modification.

In the above-mentioned embodiment, the adjusting process is performed while the pair of holes 23 of the circuit board 20 having the semiconductor laser 10 assembled thereon are held by the arm RA of the position adjusting robot. However, the present invention is not limited thereto. For example, as shown in FIG. 6, the adjusting process may be performed while the semiconductor laser 10 is directly held by an arm RA' of a position adjusting robot (a tool for adjusting the position of the light source).

In this case, it is preferable to provide a pair of recesses 13 formed at opposite sides of the outer circumference of the semiconductor laser 10, and to perform the adjusting process while holding the pair of recesses 13 of the semiconductor laser 10 by the arm RA'. According to this, it is possible to stabilize the semiconductor laser 10 during the adjusting process, and thus it is possible to improve the accuracy of the position of the semiconductor laser 10 and the pitch D between the two laser beams.

In the above-mentioned embodiment, the circuit board 20 has the holes 23 for allowing the circuit board 20 to be held. However, the present invention is not limited thereto. For example, a pair of recesses may be provided at opposite sides of the outer circumference of the circuit board. In this case, in the adjusting process, an arm of a position adjusting robot is engaged with the pair of recesses, such that the circuit board is held.

In the above-mentioned embodiment, as the tool for adjusting the position of the semiconductor laser 10, the arm RA (the position adjusting robot) has been exemplified. However, the present invention is not limited thereto. Examples of the tool for adjusting the position of the semiconductor laser 10 may include a jig which holds the frame having the coupling lens fixed thereto, and the circuit board (or the light source) having the light source assembled thereon, and moves the light source according to manipulation by an assembler, such that the position of the light source is adjusted.

In the above-mentioned embodiment, in the adjusting process (the adjustment of the pitch D), the circuit board 20 (the semiconductor laser 10) is rotated around the optical axis A. However, the present invention is not limited thereto. The adjustment of the pitch can be performed by rotating the circuit board 20 (the semiconductor laser 10) around an arbitrary axis parallel with the virtual optical axis of the optical scanning apparatus (optical system).

In the above-mentioned embodiment, as the connector, the female connector 22 provided (fixed) on the circuit board 20 has been exemplified. However, the present invention is not limited thereto. For example, the connector may be a female or male connector provided to an end portion of a wire line drawn from the circuit board. Alternatively, in the present invention, the circuit board may not have the connector.

In the above-mentioned embodiment, as the frame, the frame 40 of the light source unit 2 has been exemplified. However, the present invention is not limited thereto. For example, the frame may be the case 1A of the above-mentioned embodiment. In other words, the present invention may have a configuration in which the circuit board 20 having the semiconductor laser 10 assembled thereon, the collimator lens 30, and the like are directly supported by (fixed to) the case 1A of the light source unit 2.

In the above-mentioned embodiment, the polygon mirror 5 serving as the deflector has six mirror surfaces 5A. However, the present invention is not limited thereto. For example, the polygon mirror 5 may have four mirror surfaces. In the above-mentioned embodiment, as the deflector, the polygon mirror 5 that rotates to deflect the laser beams has been exemplified. However, the present invention is not limited thereto. Examples of the deflector may include a vibrating mirror that vibrates to deflect light.

In the above-mentioned embodiment, as the scanning lens, only one F-theta lens 6 is provided. However, the present invention is not limited thereto. For example, a plurality of F-theta lenses may be provided.

In the above-mentioned embodiment, the adhesive 50 for fixing the circuit board 20 to the frame 40 is light curing resin. However, the present invention is not limited thereto. A widely known adhesive can be used.

In the above-mentioned embodiment, the light source (the semiconductor laser 10) has two luminous points. However, the present invention is not limited thereto. For example, the light source may have three or more luminous points.

According to this method of manufacturing an optical scanning apparatus, first, the positions of the light source, relative to the coupling lens fixed to the frame, in the directions perpendicular to the optical axis and the optical axis direction, and the pitch between the plurality of beams in the sub-scanning direction on the scanned surface are adjusted, and then the light source is fixed to the frame. Therefore, after the light source is fixed to the frame, it is not required to adjust the position of the light source. As a result, it is possible to simplify the manufacturing processes.

According to this optical scanning apparatus, the circuit board having the light source assembled thereon is fixed to the frame with the adhesive. Accordingly, it is possible to increase the degree of freedom for the position of the circuit board (light source) relative to the frame, as compared to a configuration in which the circuit board is fixed to a frame with screws or the like. Therefore, it is possible to implement a manufacturing method in which the positions of the light source, relative to the coupling lens fixed to the frame, in the directions perpendicular to the optical axis and the optical axis direction, and the pitch between the plurality of beams in the sub-scanning direction on the scanned surface are first adjusted, and then the light source is fixed to the frame. As a result, after the light source is fixed to the frame, it is not required to adjust the position of the light source. Therefore, it is possible to simplify the manufacturing processes.

According to the aspect of the present disclosure, it is possible to make it unnecessary to adjust the positions of the light source after the light source is fixed to the frame. Therefore, it is possible to simplify the manufacturing processes.

What is claimed is:

1. A method of manufacturing an optical scanning apparatus which includes: a light source having a plurality of luminous points; a coupling lens configured to convert a plurality of beams from the light source into luminous flux; a deflector configured to deflect the luminous flux in a main scanning direction; a scanning lens configured to focus the luminous flux from the deflector onto a scanned surface so as to form an image; and a frame configured to support at least the light source and the coupling lens, the method comprising:

fixing the coupling lens to the frame;
assembling the light source to a circuit board for supplying power to the light source;
after assembling the light source to the circuit board, adjusting a position of the light source, relative to the coupling lens fixed to the frame, in an optical axis direction of the light source and in a direction perpendicular to the optical axis direction while the light source emits the light;
after assembling the light source to the circuit board, adjusting a pitch between the plurality of beams in a sub-scanning direction perpendicular to the main scanning direction on the scanned surface by rotating the light source around the optical axis while the light source emits the light; and
fixing the light source to the frame at the adjusted position and the adjusted pitch;
wherein at least one of the position of the light source and the pitch is adjusted while power is supplied to the circuit board; and
wherein the circuit board having the light source assembled thereon is fixed to the frame with an adhesive.

2. The method of manufacturing an optical scanning apparatus according to claim 1, wherein when adjusting at least one of the position of the light source and the pitch, the power is supplied to the circuit board by connecting an external power source to a connector provided to the circuit board.

3. The method according to claim 1, wherein
the light source is provided with a pair of recesses formed at opposite sides of an outer circumference of the light source, and
at least one of the position of the light source and the pitch is adjusted while the pair of recesses are held by an adjusting tool.

4. The method according to claim 1, wherein
the circuit board is provided with a pair of recesses or holes at an outer circumference of the circuit board, and
at least one of the position of the light source and the pitch is adjusted while the pair of recesses or holes are held by an adjusting tool.

5. An optical scanning apparatus comprising:
a light source having a plurality of luminous points;
a circuit board configured to supply power to the light source, the light source being assembled on the circuit board;
a coupling lens configured to convert a plurality of beams from the light source into luminous flux;
a deflector configured to deflect the luminous flux in a main scanning direction;
a scanning lens configured to focus the luminous flux from the deflector onto a scanned surface so as to form an image; and
a frame configured to support at least the light source and the coupling lens,
wherein the circuit board is fixed to the frame with an adhesive in a state that a position of the light source relative to the coupling lens fixed to the frame in an optical axis direction of the light source and in a direction perpendicular to the optical axis direction while the light source emits the light is adjusted, and a pitch between the plurality of beams in a sub-scanning direction perpendicular to the main scanning direction on the scanned surface is adjusted.

6. The optical scanning apparatus according to claim 5, wherein:
the circuit board includes a connector configured to be connected to an external power source for supplying power to the light source.

7. The optical scanning apparatus according to claim 5, wherein the adhesive is light curing resin.

8. The optical scanning apparatus according to claim 5, wherein the circuit board does not contact the frame and is connected to the frame only through the adhesive.

* * * * *